Nov. 11, 1952 W. VAN B. ROBERTS 2,617,882

MAXIMAL FLATNESS FILTER

Filed May 29, 1950 2 SHEETS—SHEET 1

INVENTOR
Walter van B. Roberts
BY Harry Tunick
ATTORNEY

INVENTOR
Walter vanB.Roberts
BY
ATTORNEY

Patented Nov. 11, 1952

2,617,882

UNITED STATES PATENT OFFICE 2,617,882

MAXIMAL FLATNESS FILTER

Walter van B. Roberts, Princeton, N. J., assignor to Radio Corporation of America, a corporation of Delaware Application May 29, 1950, Serial No. 164,981

8 Claims. (Cl. 178—44)

This invention relates to electromechanical filters, and more particularly to bandpass filters employing mechanical resonators.

An object of this invention is to provide a filter of the so-called maximal flatness type employing mechanical resonators.

Another object is to provide a maximally flat multi-section filter in which the couplings between the cascaded resonant circuits are nonresonant circuits or aperiodic. More specifically, successive circuits are coupled only by means of mutual inductance.

A further object is to devise a maximally flat bandpass filter (BPF) having negligible losses in its interior circuits.

A still further object is to devise a bandpass filter composed of both electrical and mechanical resonant circuits.

Yet another object is to devise a maximally flat filter, of very simple design, including both electrical and mechanical tuned circuits.

Still another object is to devise a bandpass filter of three to five coupled resonant circuits in which all of the interior resonators and couplings are identical.

An additional object is to provide a bandpass filter including a mechanical resonant element which has both a high Q and good magnetostrictive activity.

The foregoing and other objects of this invention will be best understood from the following description of some examples thereof, reference being had to the accompanying drawings, wherein.

The objects of this invention are accomplished, briefly, in the following manner: a bandpass filter of the maximal flatness type is composed of a plurality of coupled resonant circuits all tuned to the same frequency, the end circuits being electrical and the interior, mechanical. This filter is symmetrical about its center and, because of its mechanical interior circuits, has negligible losses in such interior circuits. These resonant circuits are coupled in cascade only by means of mutual inductance, in the electrical analogy. For three to five resonant circuits, the mechanical resonators and mechanical couplings are all identical, simplifying the design.

A maximally flat bandpass filter is defined as a chain or cascade of $n$ coupled resonant circuits so arranged that the reciprocal of the square of the output current amplitude is proportional to unity plus the $2n$th power of the product of a constant and the frequency departure from midband. The bandwidth is defined as extending between the frequencies at which the aforesaid power term is unity. It will be evident that, with this type of filter, the output current, for a constant input voltage, has no peaks and valleys but only a single broad flat-topped maximum. This is in striking contrast to the ouput characteristic of the conventional type filter, which characteristic has peaks and valleys when terminated in resistance equal to its midband iterative impedance.

A maximal flatness type of bandpass filter, or one which is free from the peaks and valleys or irregularities just referred to, is disclosed in the expired Bennett Patent #1,849,656, dated March 15, 1932. The filter of this patent (Fig. 4 thereof represents the bandpass type of filter) consists of only electrical circuits. The series branches, which consist of resonant circuits, are coupled together by shunt branches which are anti-resonant or parallel resonant. Bennett defines, on page 2 of his patent, a number of factors $a_1$, $a_2$, etc., which are numerical coefficients that may be used to compute the value of his series and shunt impedances. These factors $a_1$, $a_2$, etc., are defined in the said patent as follows:

$$a_1=2\sin\frac{\pi}{2n}$$

$$a_2=2\sin\frac{3\pi}{2n}$$

$$a_3=2\sin\frac{5\pi}{2n} \qquad (1)$$

etc., or in general, $$a_r=2\sin\frac{(2r-1)\pi}{2n} \qquad (2)$$

In the foregoing expressions, $n$ denotes the total number of cascaded circuits and $r$ denotes the order of a circuit being considered, counting from one end of the cascade.

Figure 1:
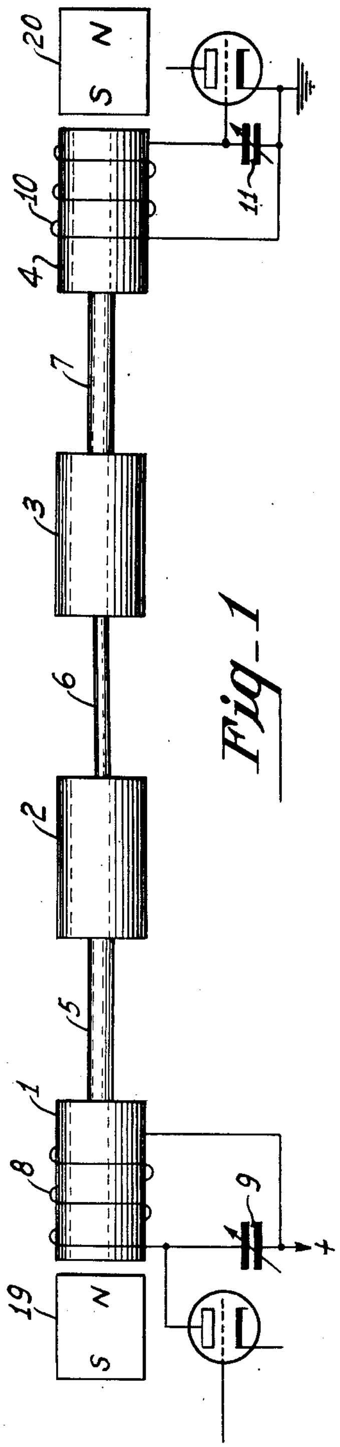
Fig. 1 is a representation of a bandpass filter according to this invention.
Figure 2:
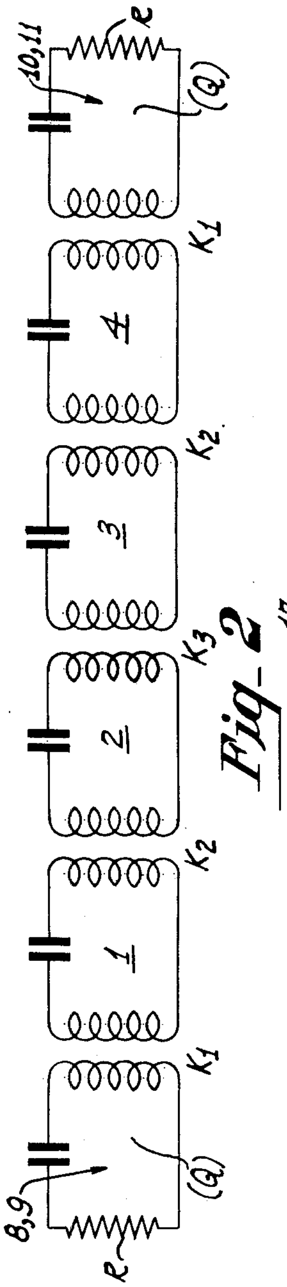
Fig. 2 is an equivalent electrical circuit of Fig. 1.

The expressions given above at (1) and (2) are not directly applicable to a cascaded coupled bandpass filter of the type shown in Figs. 1 and 2. Fig. 2 is the electrical analogue or electrical equivalent of the arrangement of Fig. 1. In Fig. 1, a cascade of six resonant circuits is shown, all of these circuits being tuned to the same frequency. The two end circuits of the cascade are electrical, while all of the interior circuits are mechanical. Fig. 1 represents a four-section or four-circuit neck-coupled mechanical arrangement coupled to a coil at each end. The mechanical arrangement is of a type generally similar to that disclosed in my copending joint application, Serial No. 84,372, filed March 30, 1949. Such an arrangement consists of four aligned vibratile mechanical resonant elements 1, 2, 3 and 4, which are spaced from each other. Elements 1—4 may be termed resonators. Adjacent elements of the row are coupled together by thinner portions, termed "necks." Thus, resonant elements 1 and 2 are coupled together by coupling element 5, resonant elements 2 and 3 are coupled together by coupling element 6 and resonant elements 3 and 4 are coupled together by coupling element 7. The four-section arrangement 1—7 is mounted to be capable of vibrating mechanically.

The neck-coupled arrangement 1—7 may be formed from a suitable metal, such as nickel or aluminum, as disclosed in said copending application. On the other hand, as will hereinafter appear, such arrangement may be formed from a suitable powdered compressed material, such as ferrite. The arrangement may be punched out of flat sheet metal or it may be formed as a figure of revolution, as disclosed in said application. If it is a figure of revolution, it may be machined out of a single piece of stock or it may be formed of spaced cylinders fastened onto rod or tubing, as disclosed in said application.

According to the present invention, magnetostrictive drive and take-off of the mechanical circuits are utilized. In order to accomplish this, at least the end resonators 1 and 4 must have good magnetostrictive activity. They may be made of a material having good magnetostrictive activity, such as nickel, or they may be plated with nickel, in accordance with the principles disclosed in the copending Burns application, Serial No. 84,373, filed March 30, 1949. Alternatively, the entire arrangement 1—7 may be made of ferrite, which has relatively high magnetostrictive activity. A driving coil 8 is coupled to resonant element 1. This coil has a condenser 9 connected across it to provide an electrical resonant circuit 8, 9 which serves as one end resonant circuit of the bandpass filter. Coil 8 is connected in the output circuit of an amplifier tube as shown. The dimensions of the interior mechanical resonant circuits 1—4 determine the resonant frequencies of such circuits. Circuit 8, 9 has the same resonant frequency as do all of the loosely-coupled mechanical circuits 1—4. A pickup coil 10 is coupled to resonant element 4. This coil has a condenser 11 connected across it to provide an electrical resonant circuit 10, 11 which serves as the other end resonant circuit of the bandpass filter. Coil 10 is connected in the input circuit of an amplifier tube as shown. Circuit 10, 11 has the same resonant frequency as do all of the mechanical and electrical resonant circuits so far described. The bandpass filter of Fig. 1 consists of four interior mechanical resonant circuits 1, 2, 3 and 4 and two end electrical resonant circuits 8, 9 and 10, 11.

Mechanical resonators of the above-described type (either metallic or ferrite) have very low mechanical losses. In fact, their losses are so low as not to affect the results appreciably in practical cases. In other words, the losses in all of the interior circuits of Fig. 1 are inappreciable or negligible. Therefore, it will be assumed that only the input and output resonant circuits have any losses. This assumption is justified when it is considered that the mechanical Q of aluminum is of the order of 10,000, of ferrite is over 1,000 and of nickel is a few hundred. These Q's are mostly high as compared with the maximum Q obtainable in practical electrical coils.

Fig. 2 is the electrical equivalent of the Fig. 1 arrangement. The electrical end circuits 8, 9 and 10, 11 have losses; therefore, in Fig. 2 there are resistors R included in these circuits. Since there are negligible losses in circuits 1—4, these circuits are indicated as being composed of inductance and capacitance only. Coil 8 is inductively coupled to circuit 1 with a coupling coefficient $K_1$. This is an aperiodic, nonresonant, mutual-inductance-type coupling.

The bandpass filter of Fig. 1 is structurally symmetrical about its center. Therefore, coil 10 is similarly coupled to circuit 4, with a coupling coefficient $K_1$. The Q's of the end circuits 8, 9 and 10, 11 are equal. Resonator 1 is coupled to circuit 2 by means of neck coupling element 5, which acts somewhat like a weak spring. Therefore, in the electrical analogy of Fig. 2, circuit 1 is coupled to circuit 2 by an aperiodic, nonresonant, reactance-type coupling with a coupling coefficient $K_2$. Similarly, circuit 3 is coupled to circuit 4 with a coupling coefficient $K_2$, due to symmetry. Resonator 2 is coupled to resonator 3 by means of neck coupling 6 which, as shown in Fig. 1, has a width different from that of necks 5 and 7. The fact of this difference will appear again hereinafter. In Fig. 2, circuit 2 is coupled to circuit 3 by an aperiodic, nonresonant, mutual-inductance-type coupling with a coupling coefficient $K_3$.

It has been found that the relations disclosed in the aforesaid patent require some revision before they can be applied to a cascaded bandpass filter of the type shown in Fig. 2, with nonresonant couplings between the successive resonant circuits of the cascade. Furthermore, there are negligible losses in the interior circuits of the cascade of this invention, a fact which renders Fig. 2 different in another respect.

Let us denote the fractional bandwidth by B. The fractional bandwidth may be defined as the ratio of the bandwidth in cycles per second to the midband frequency in cycles per second. Q will denote the Q of the end circuits 8, 9 and 10, 11. According to this invention, maximal flatness operation is obtained with the circuit of Fig. 2 (or with a plurality of cascaded resonant circuits coupled by means of aperiodic couplings) if the following condition is satisfied:

$$Q=\frac{a_1}{B} \tag{3}$$

the $a_1$ being defined in Equation 1 above. Combining (1) with (3), we have $$Q=\frac{2\sin\frac{\pi}{2n}}{B} \tag{4}$$

Since the filter of Fig. 1 is of symmetrical arrangement about its center, the coefficient of coupling between circuits 3 and 4 is $K_2$ and that between circuits 4 and 10, 11 is $K_1$. According to this invention, another condition that must be fulfilled for a maximal flatness bandpass filter of the Fig. 1 type is:

$$K=\frac{B}{2\sqrt{a_r-a_{r+1}}} \qquad (5)$$

wherein K is the coefficient of coupling between the $r$th circuit and the $(r+1)$th circuit. Combining (2) with (5), we have $$K=\frac{B}{2\sqrt{\sin\frac{(2r-1)\pi}{2n}\sin\frac{(2r+1)\pi}{2n}}} \qquad (6)$$

It is noted that $r$ and $n$ have previously been defined above in connection with Equations 1 and 2. Equation 6 gives an expression for the coefficient of coupling between any one resonant circuit (of Figs. 1 or 2) and the following resonant circuit.

It is to be noted that Equations 1 to 6 are applicable to bandpass filters comprising a plurality of coupled cascaded resonant circuits, in which the losses are negligible in all of the interior circuits of the cascade. For practical purposes, this means that the interior resonant circuits must be mechanical and the end circuits, electrical. The conditions are applicable to couplings of the type illustrated in Fig. 2, in which the couplings are nonresonant or aperiodic, the coupling being effected only by means of mutual inductance.

Since all of the "$a$" factors are different, as may be seen from Equations 1 and 2, the coefficients of coupling $K_1$, $K_2$ and $K_3$ are all different, as may be seen from Equation 5. This calls for a "tapered" construction in which the coefficients of coupling between successive resonant circuits change progressively from both ends toward the center of the filter. A "tapered" construction, in which the filter is of symmetrical arrangement about its center, calls for a total of at least six resonant circuits. For a total of three to five resonant circuits, as will hereinafter appear, the mechanical resonators and coupling elements are all alike. In the "neck-coupled" construction of Fig. 1, the "tapering" means that neck 6 must be of smaller cross section than necks 5 and 7, necks 5 and 7 being equal to each other in cross section. This difference in coupling coefficients may be seen from a study of Equation 6. For neck 6, the factor $r$ is greater than for neck 5, the order $r$ of the resonant circuit being considered at any time generally being counted from the left end of the bandpass filter.

In the construction of Fig. 1, all of the mechanical resonators 1—4 have the same cross section and are all tuned to the same frequency. These mechanical resonant circuits are also tuned to the same frequency as are the electrical end circuits 8, 9 and 10, 11. The necks 5 and 7 have the same cross section, which is greater than that of neck 6. This is the result of the "tapered" coupling coefficient relation described above. It should be understood, however, that the resonators need not be alike in cross section. It is only the ratio of resonator section to neck section that is fixed by the required value of K.

Figure 3:
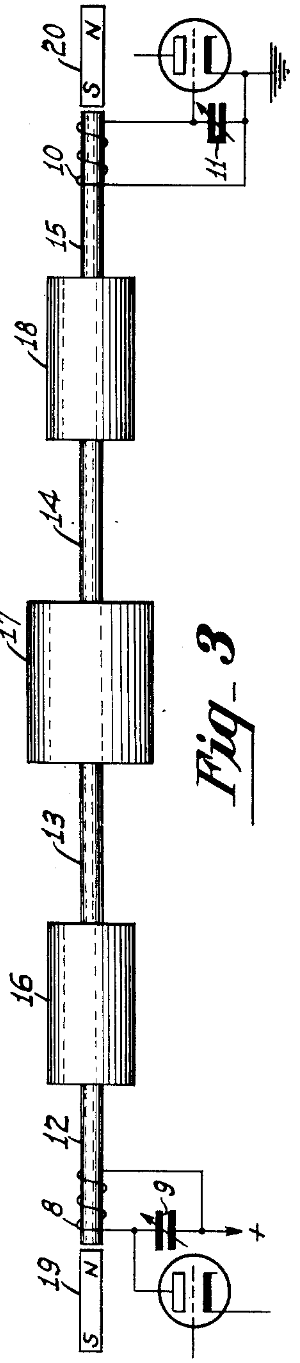
Fig. 3 is a representation of a modified bandpass filter.

The conditions expressed in Equations 1 to 6 are equally applicable to a bandpass filter of the type shown in Fig. 3. In this arrangement, there is a four-section or four-circuit slug-coupled mechanical arrangement coupled to coil 8 at one end and to coil 10 at the other end. This mechanical arrangement is also of a type generally similar to that disclosed in the aforementioned joint application. Here the mechanical resonators 12, 13, 14 and 15 are coupled together by intervening "slugs" 16, 17 and 18. Driving coil 8 is coupled to resonant element 12 and take-off coil 10 is coupled resonant element 15. The bandpass filter of Fig. 3 has the same electrical equivalent (shown in Fig. 2) as does the filter of Fig. 1.

The bandpass filter of Fig. 3 is again a six-circuit filter, having four interior mechanical resonant circuits 12—15 and two electrical end circuits 8, 9 and 10, 11. The mechanical resonators 12—15 all preferably but not necessarily have the same cross section. In any case, they are all tuned to the same frequency. They are also tuned to the same frequency as are the electrical end circuits 8, 9 and 10, 11.

Equations 1 to 6 apply with equal force to the bandpass filter of Fig. 3, these equations setting forth the conditions which must be satisfied for a maximal flatness filter characteristic. For Fig. 3, the "tapered" coupling coefficient relation given in the above equations means that the slug coupling elements 16 and 18 have the same cross section, which is smaller than that of slug coupler 17. In Fig. 3, the filter is again of symmetrical arrangement about its center, the losses are negligible in all of the interior circuits of the cascade, and the coefficients of coupling between successive resonant circuits change progressively from both ends toward the center of the filter. There are six resonant circuits in the bandpass filter of Fig. 3, four being mechanical and the remaining two, electrical.

By means of the expressions previously given, the K's or coupling coefficients of the bandpass filter can be ascertained. The bandpass filter of this invention is not limited to any particular dimensions of resonators or of coupling elements. It is only the relation between them (the K) which is important or which must fulfill a certain condition to result in a maximal flatness filter. Thus, the dimensions of the resonators may be chosen to have a convenient value, and then the size of the couplers is made such as to give the correct value of K. Once the size of the resonators has been chosen, it is the size of the coupling elements which then determines the coefficient of coupling K, or vice versa.

The mechanical resonant elements have substantially no mechanical losses, as is indicated by their very high values of Q (previously given as examples), as compared to the maximum values of Q obtainable with electrical coils. It is practically impossible to obtain an electrical coil or resonant circuit with inappreciable losses or negligible losses. Therefore, an important feature of this invention is to devise a bandpass filter using both mechanical and electrical resonant circuits, to reduce the losses in such filter as much as possible. In other words, the mechanical interior circuits act like electrical circuits, insofar as filtering action is concerned, but have negligible losses.

In addition to the feature of substantially no losses in the interior circuits, several other advantages result from the combination of electrical and mechanical resonant circuits in a bandpass filter. In the first place, the use of mechanical in combination with electrical resonant circuits decreases the cost of the filter, as compared with one using only electrical circuits. Mechanical resonators are not likely to become detuned, as do electrical circuits. Also, the filter is more compact when the interior resonant circuits thereof are mechanical, than when the entire bandpass filter is composed of electrical resonant circuits. This is more noticeable, and more important, at lower frequencies, where electrical filters have a tendency to become rather bulky and space-consuming.

Due to the fact that the numerator of the right hand side of Equation 4 has a rather low value (the greater the number of total circuits, the lower this value), the Q of the end circuits is also quite low, even though the fractional bandwidth B is rather small. In other words, by the arrangement of this invention it is possible to make a maximally flat bandpass filter with a reasonable value of Q for the end circuits. The Q required can thus be reduced to a value that can be easily obtained with ordinary coils.

Due to the fact that the losses in the interior circuits of the bandpass filter are negligible, the gain when using the bandpass filter of this invention is almost as good as that obtained when using an ordinary two-circuit transformer of the same bandwidth. The efficiency of the bandpass filter of this invention is high, due to its very low losses.

Referring again to Fig. 1, a pair of polarizing magnets 19 and 20 are provided to magnetize the material for proper magnetostrictive action. Magnet 19 is placed adjacent to resonator 1 and magnet 20 is adjacent resonator 4. In effect, the positions of these magnets may be changed to vary the coupling between the coils and the end mechanical resonators.

For filters composed of five or less like-tuned resonant circuits, it has been found unnecessary to make all the resonators and couplings different from each other. In fact, all of the mechanical resonators and all of the mechanical couplings can be made identical. These statements presuppose that maximally flat filter transmission is desired. The construction of a mechanical filter is simplified by making as many portions alike as possible. In accordance with the principles previously described, electrical resonant circuits are employed as the end circuits of the filter and one or more mechanical resonators as the interior circuits.

For the sake of an orderly development of the subject, it may be well to start by considering a simple tuned circuit. It can readily be shown that if there is any resistance, the current can be expressed, for a narrow band response at least, in the form stated above, referring to the definition of a maximally flat filter. So, any tuned circuit or resonant system may be considered as the simplest form of maximal flatness filter. Two coupled circuits will have a doubly peaked output if the coupling is greater than "critical." If the coupling is less than critical there will be only a single peak, but the output is not expressible by the formula given above as defining a maximally flat bandpass filter. If critically coupled, however, the ordinary double-tuned transformer can be considered to be a maximally flat filter.

When more then two resonant circuits are employed the analysis becomes more complicated, and in what follows it will be assumed that only the input and output resonant circuits have any losses. As previously stated, this assumption is allowable when mechanical resonators are used, as their losses are so low as to be inappreciable.

Figure 4:
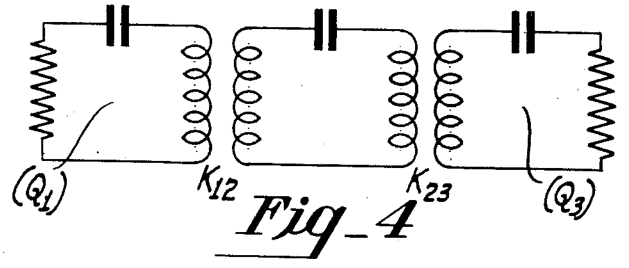
Figs. 4, 6 and 7 are equivalent electrical circuits of other bandpass filters.

In the case of three resonant circuits of the type shown in Fig. 4, maximal flatness operation is obtained when $$\frac{1}{Q_1^2}=3K_{12}^2-K_{23}^2 \qquad (7)$$

and $$\frac{1}{Q_3^2}=3K_{23}^2-K_{12}^2 \qquad (8)$$

In the above expressions, $Q_1$ and $Q_3$ are the Q's of the first and third resonators and $K_{12}$ and $K_{23}$ are the coefficients of coupling between the first and second, and second and third, resonators, respectively. The bandpass filter illustrated in Fig. 4 is electrically similar to that of Fig. 2, except that the former comprises only three resonant circuits rather than six. It will be seen that the couplings can be chosen arbitrarily, except that their ratio must not exceed $\sqrt{3}$ (or be less than $\sqrt{1/3}$, according to the particular ratio taken), for otherwise one of the required Q's would become imaginary. At the critical ratio, $\sqrt{3}$, one of the Q's becomes infinite, so that damping must be used at only one end of the filter. The least value of Q required occurs when the coupling coefficients are nearly equal. If they are equal, the condition for maximal flatness becomes simply $$\frac{1}{Q^2}=2K^2 \text{ or } QK=\sqrt{1/2}=.707 \qquad (9)$$

where Q and K now apply to both ends of the filter.

As one illustration of a three-circuit maximally flat filter, we can use three mechanical resonators. The simplest way to assure equal coefficients of coupling is to make the filter symmetrical about its center. The equal dampings of the end resonators will be determined by the fractional bandwidth B, which in this case is $K\sqrt{2}$. The maximally flat condition for this case is then simply that the Q of the end resonators must be made the reciprocal of B. This is true regardless of the relative dimensions of the resonators and hence includes a simple two-section filter.

As a second illustration, a bandpass filter may be composed of a single mechanical resonator 21 (see Fig. 5) which is coupled at each end to an electrical tuned circuit 8, 9 and 10, 11 by magnetostriction. In general, it is likely to be difficult to obtain a close enough coupling to produce a wide band (the bandwidth being directly proportional to the coupling coefficient), while if a narrow band is desired it may be difficult to obtain high enough Q in the electrical circuit to equal the reciprocal of the fractional bandwidth B. However, I have found that it is possible to obtain a range of usefully broad bandwidths for which circuits of sufficient Q are readily obtained, by using a ferrite rod 21 as the middle resonator. Ferrite is a ceramic magnetostrictive material.

Ferrrite has negligible mechanical losses, having a very good mechanical Q, one which is substantially higher than that of the coils coupled to it. Ferrite does not lower the Q of the coils coupled to it, and has a relatively high magnetostrictive activity.

Figure 5:
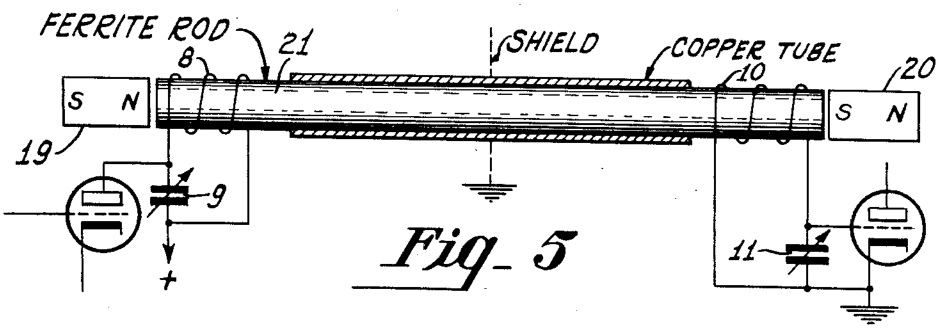
Fig. 5 is a representation of another bandpass filter of this invention.

Fig. 5 shows a ferrite rod 21 with a tuned coil 8 on one end and a tuned coil 10 on the opposite end. Intermediate its ends, rod 21 has a copper tube and grounded shield arrangement to eliminate any direct coupling between coils. This shield arrangement may be somewhat as disclosed in my copending application, Serial No. 76,586, filed February 15, 1949. The filter of Fig. 5 was found to give maximal flatness transmission within accuracy of measurement, the bandwidth being 8 kc. at 429 kc., a B of 1.85 per cent. The coil Q required by this band is about 54, a value very easy to obtain. The ferrite rod uesd in this filter was about 0.2 cm. square and 4.48 cm. long, the ends projecting .85 cm. from the quarter-inch copper tube.

Polarizing magnets 19 and 20 had to be placed about a quarter of an inch from each end of the ferrite to obtain the necessary coupling to make the B match the Q that the coils 8 and 10 happened to have. A narrower band could easily be obtained by reducing the polarizing fields or by moving the coils partially off the ferrite or both. Of course, for a narrower band better coils would have to be obtained. A somewhat broader band could also be obtained by using the optimum field and making coils to fit more closely over the ferrite, the Q of the coils in this case being made lower either by coil design or by connecting a resistor across the coil.

It should also be mentioned at the frequency stated the particular ferrite referred to was seven half waves long. By using a shorter ferrite, everything else being the same, the coefficient of coupling K would be greater, since the coils would be coupled to a greater proportion of the ferrite. The reason for using such a long ferrite was to provide adequate shielding between coils. If both length and diameter of the ferrite were decreased, shielding could be maintained and bandwidth increased.

In Fig. 5, a three-section or three-circuit bandpass filter is disclosed, the interior resonant circuit 21 being mechanical and the end resonant circuits 8, 9 and 10, 11 electrical. Obviously, the resonator 21 is of any desired proportions and is of course identical with itself.

Figure 6:
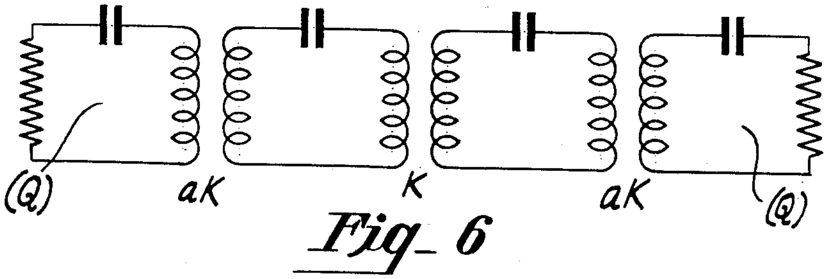

In the case of four tuned circuits, symmetrical about the center of the filter and with no losses in the interior circuits, let $a$ denote the ratio of coupling coefficient of the two end couplings to the coefficient of coupling of the interior coupling. Let $c$ be the ratio of reactance of the end circuits to that of the middle circuits, while $s$ is the resistance of the end circuits. Such a four-circuit bandpass filter is illustrated in Fig. 6. In this case the requirements for maximal flatness are $$s^2=c^2+2a^2c \qquad (10)$$

and $$\frac{a^2}{c}=1+\sqrt{2} \qquad (11)$$

From these conditions it may be seen that either $a$ or $c$ can be chosen arbitrarily. If for example, we choose $c=1$, so that all circuits will be alike, then $$a^2=1+\sqrt{2}=2.414;\ a=1.554 \qquad (12)$$

and $$s^2=3+2\sqrt{2}$$

where the mutual reactance between the middle or interior circuits has been taken as unity. It thus may be seen that a cascade of four identical mechanical resonators can be made to give maximally flat transmission by putting the proper damping on the end resonators, provided the end coupling necks have sufficiently larger cross sections than the middle neck. Conversely, we could chose $a=1$ so that all three necks would be alike, and make the end resonators of smaller cross section than the middle ones.

If the filter is made with mechanical resonators for the two interior circuits and electrical resonant circuits at the ends, it is more convenient to express the maximally flat conditions in terms of coefficients of coupling K and the Q of the end circuits. If $a$ represents the ratio of the same coefficient of coupling of the end couplings to that of the interior coupling, the required condition is as expressed in (12) above. If K is the middle coefficient of coupling, then $$\left(\frac{1}{QK}\right)^2=1+\sqrt{2} \text{ or } QK=.643 \qquad (13)$$

With the requirements expressed this way the end circuits may have any desired ratio of inductance to capacitance, as only their Q's and their coupling coefficients K are involved in the maximally flat conditions. In actual practice, the middle circuits (i. e. the mechanical resonators) and the coupling neck between them are made up first, and then by a cut-and-try process a combination of their couplings and Q is determined which results in a satisfactory performance, just as described in the case of the three-circuit filter.

The mechanical resonators for Fig. 6 could be made up similarly to the mechanical portions of Figs. 1 or 3, for four resonant circuits there being two mechanical resonators (identical in construction) joined by a single coupling element, and two electrical end circuits.

Figure 7:
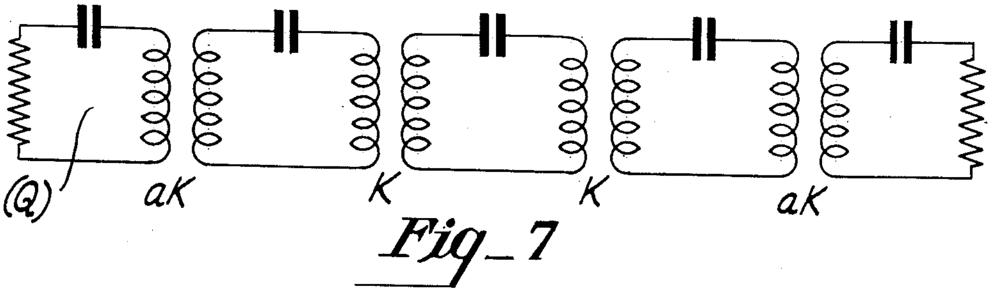

In the case of five circuits symmetrical about the center (illustrated in Fig. 7), let $a$ be the ratio of the end coupling coefficients to the two interior coupling coefficients, let $b$ denote the ratio of reactance of circuits #2 and #4 (counting from one end of the chain) to that of circuit #3, let $c$ denote the ratio of reactance of the end circuits (#1 and #5) to that of the middle circuit (#3) and let $s$ be the resistance in the end circuits. Then the conditions for maximal flatness are $$bs^2=1/2a^2(a^2+2c) \text{ and } \frac{a^2}{c}=1+\sqrt{5}$$

An important special case is $c=1$, which gives as the necessary and sufficient conditions $$a^2=1+\sqrt{5};\ a=1.799 \qquad (14)$$

and $$\left(\frac{1}{QK}\right)^2=4+2\sqrt{5} \text{ or } QK=.343 \qquad (15)$$

It is thus seen that if the three interior circuits are identical mechanical resonators with identical couplings, it will be possible to obtain maximal flatness with electrical end circuits, by proper choice of their coefficients of coupling, K, and their Q's. The mechanical resonators for Fig. 7 coud be made up similarly to the mechanical portions of Figs. 1 or 3, for five resonant circuits there being three mechanical resonators (identical in construction) joined by two identical coupling elements, and two electrical end circuits.

Up to five resonant circuits, it is possible to obtain maximally flat operation by suitable choice of the Q and coupling of the end circuits, the others being identical and having identical coupling elements between them. Thus, if the end circuits are electrical and the remainder, mechanical, no "tapering" is required in the mechanical structure.

The formulae given at (9) and (12)—(15) above, apply to electrical or mechanical circuits or a mixture, as long as the filter is symmetrical about its center and the losses are negligible except in the end circuits. In practice, electrical circuits are not sufficiently low loss to be usable for interior circuits unless the band is so wide that their losses are actually negligible. So, for the usual narrow band application the interior circuits should be mechanical.

The end circuits can be mechanical also, but it should be noted that for four or five circuits this requires a coefficient of coupling at the ends different from that in the interior, which is not always easy to predetermine. In any case, the end circuits must be loaded down to the required Q, which also is not easy to do. The mechanical resonators normally have very high Q's.

Where the Q of an electrical circuit can be made large enough to serve as the end circuit, and the coupling can be great enough to satisfy the conditions previously discussed, electrical end circuits and mechanical interior circuits (the latter all identical) form the ideal combination.

What I claim to be my invention is as follows:

1. A bandpass filter, comprising a plurality of resonant circuits coupled in cascade by means of aperiodic couplings, the coefficient of coupling between any one resonant circuit and the following resonant circuit being equal to $$\frac{B}{2\sqrt{\sin\frac{(2r-1)\pi}{2n}\sin\frac{(2r+1)\pi}{2n}}}$$

where $n$ is the total number of circuits, B is the width of the frequency band passed by said filter divided by the midband frequency, and $r$ denotes the order of said resonant circuit counting from one end of the filter.

2. A bandpass filter, comprising a plurality of resonant circuits coupled in cascade by means of aperiodic couplings, the Q of each end circuit being equal to $$\frac{2\sin\frac{\pi}{2n}}{B}$$

and the coefficient of coupling between any one resonant circuit and the following resonant circuit being equal to $$\frac{B}{2\sqrt{\sin\frac{(2r-1)\pi}{2n}\sin\frac{(2r+1)\pi}{2n}}}$$

where $n$ is the total number of circuits, B is the width of the frequency band passed by said filter divided by the midband frequency, and $r$ denotes the order of said one resonant circuit counting from one end of the filter.

3. A bandpass filter in accordance with claim 1, wherein there are at least six resonant circuits, wherein the filter is of symmetrical arrangement about its center, and wherein the coefficients of coupling between successive resonant circuits change progressively from both ends toward the center of the filter.

4. A bandpass filter in accordance with claim 2, wherein there are at least three resonant circuits, wherein all of the resonant circuits are tuned to the same frequency, and wherein the losses are negligible in all of the interior circuits of the cascade.

5. A bandpass filter in accordance with claim 2, wherein there are at least three resonant circuits, wherein all of the resonant circuits are tuned to the same frequency, and wherein the two end circuits of the cascade are electrical and the remainder are mechanical.

6. A bandpass filter in accordance with claim 2, wherein there are at least six resonant circuits, wherein the filter is of symmetrical arrangement about its center, wherein the coefficients of coupling between successive resonant circuits change progressively from both ends toward the center of the filter, wherein all of the resonant circuits are tuned to the same frequency, and wherein the losses are negligible in all of the interior circuits of the cascade.

7. A bandpass filter, comprising three cascaded coupled resonant circuits all tuned to the same frequency, the filter being of symmetrical arrangement about its center and the losses being negligible in the one interior circuit, the Q of the two end circuits bearing approximately the following relation to the same coefficient of coupling K of the two couplings:

$$Q=\frac{.707}{K}$$

8. A bandpass filter, comprising three cascaded coupled resonant circuits all tuned to the same frequency, the filter being of symmetrical arrangement about its center and being composed of one mechanical interior circuit and two electrical end circuits, the Q of the two end circuits bearing approximately the following relation to the same coefficient of coupling K of the two couplings:

$$Q=\frac{.707}{K}$$

WALTER VAN B. ROBERTS.

REFERENCES CITED

The following references are of record in the file of this patent:

UNITED STATES PATENTS

| Number | Name | Date |
|---|---|---|
| 1,603,806 | Riegger | Oct. 19, 1926 |
| 1,788,519 | Harrison | Jan. 13, 1931 |
| 1,849,656 | Bennett | Mar. 15, 1932 |
| 2,001,387 | Hansell | May 14, 1935 |
| 2,020,377 | Roberts | Nov. 12, 1935 |
| 2,231,404 | Blackman | Feb. 11, 1941 |
| 2,501,488 | Adler | Mar. 21, 1950 |
| 2,571,019 | Donlevy et al. | Oct. 9, 1951 |

OTHER REFERENCES

Roberts et al. RCA Review, Sept. 1949, pp. 348–365.